United States Patent [19]
Smith

[11] Patent Number: 5,559,469
[45] Date of Patent: Sep. 24, 1996

[54] VACUUM TUBE AMPLIFIER WITH SELECTABLE POWER DEVICES

[76] Inventor: Randall C. Smith, 1317 Ross St., Petaluma, Calif. 94952

[21] Appl. No.: 213,123

[22] Filed: Mar. 14, 1994

[51] Int. Cl.$^6$ ................ H03F 3/26; H03F 3/68
[52] U.S. Cl. ................ 330/123; 330/124 D
[58] Field of Search ............... 330/51, 118, 120, 330/122, 123, 124 D, 124 R, 300, 3; 381/120

[56] References Cited

U.S. PATENT DOCUMENTS 4,593,251  6/1986  Smith ...................... 330/123

OTHER PUBLICATIONS

Hust, Lloyd B., "Extended Class A Amplifier", Radio and Television News, Sep. 1953, pp. 40–42 & 146–148.

*Primary Examiner*—Steven Mottola
*Attorney, Agent, or Firm*—James D. Ivey

[57] ABSTRACT

A power output amplifier for use with electric guitar wherein the individual pairs of power tubes are of two or more differing types which may be selected by the user to operate alternately or simultaneously.

10 Claims, 1 Drawing Sheet

1

VACUUM TUBE AMPLIFIER WITH SELECTABLE POWER DEVICES

FIELD OF THE INVENTION

This application relates to amplifiers, and particularly relates to a vacuum tube amplifier with selectable power devices.

BACKGROUND OF THE INVENTION

The field of amplification for use with electric guitar is subjective and eclectic to a degree found nowhere else in the "sciences". Indeed, creating musical responses that satisfy a wide range of guitarists is more an art akin to, say fine cooking, than it is an objective, predictable enterprise. As evidence, one need only observe that many musically and commercially successful amplifiers are the products of experimenters with minimal formal training while noting that the wayside is littered with the failed endeavors of trained engineers whose products were "correctly designed".

Perhaps the present invention falls somewhere in between art and science since at least an historical basis can be recognized for why it satisfies a hitherto unmet need of guitarists.

In a strictly technical sense, one vacuum tube power device works just the same as another; certainly plate dissipation and current handling abilities may differ among a selection of pentodes but on paper at least "they all conduct, and current is current".

Yet while that is obviously true in the strict sense, there exist enormous differences in the musical styles created by different tube types in a given power amplifier and these styles are immediately detectable to most advanced guitarists. Furthermore, these differences in both the dynamic feel and the sonic character impart a unique signature that is often recognizable as the historical foundation of an entire musical style.

GENERAL DESCRIPTION

A very clear instance of this phenomenon where the particular type of device is endemic to a given musical style is exemplified by the very different musical signatures of the 6V6 and EL-84 type pentodes. And in fact these two types are the subjects of the preferred embodiment of the present invention. Both types have modest power handling capabilities of around 15 watts per pair. Both were widely used in the 1950's and 1960's, which were the formative years of electric guitar. And as it turns out, both types have nearly identical plate characteristics. Yet their individual musical signatures are vastly different.

The 6V6 was widely used by the Fender Musical Instrument Co., during the '50's and '60's for their low power models. And these amplifiers were popular with "electric blues" style guitarists who, in the days before public address systems, often found their amps underpowered. So they simply turned them up!. Of course, the amp ran out of power and distorted heavily. But the distortion quickly became used as a further tool of musical expression and one can picture the evocative wailing, nearly crying sound this distortion could produce when in the right hands. The 6V6 sound may be characterized thus: while operating below the distortion threshold the sound is "skinny"—not objectionably thin but bright nevertheless with bouncy, resilient dynamics. When overdriven, the low order second and third harmonics rise to predominance, obscuring the bright high frequencies and "fattening" the sound in a way which is a trademark of American blues. When severely overdriven, the distortion characteristic goes beyond what is desirable to produce an inarticulate low end which is bloated and tubby, obliterating most other frequencies with its woofiness.

Meanwhile in Europe—particularly England—during the same time period, the EL-84 was the power tube of choice in small amplifiers. The sound of this tube is very different from that of the 6V6. In its linear region it possesses a glassy brightness whose emphasis is in frequencies higher than the bright zone of the 6V6. Its dynamic character seems less resilient and when driven into distortion, higher order harmonics predominate and an aggressive, snarling bite ensues. Overdriven to extremes, it does not suffer from low end bloatiness but retains a more balanced spectrum with its aggressive mid-range character predominating.

It is no wonder then, that when British guitarists began turning up their amps and "playing the blues", it sounded quite different from the Americans they were imitating. It's fair to say that differences may have been less cultural and more technical—and largely owing to the differing tube types: American amplifiers used 6V6 or 6L6 types; the European units (which were sometimes identical to American circuits except for the power tubes) used EL-84 and EL-34 types. Since both of these European tube types can be characterized as possessing a more snarling, aggressive mid-range distortion than 6V6 or 6L6 tubes, it is easy to see how "bad attitude" rock and roll styles such as heavy metal developed from blues based music being played on amps fitted with European tubes and cranked up into heavy distortion.

In the present invention a power amplifier is provided with a plurality of tube types and includes a switch means by which different pairs of output devices may be operated alternately or combined for simultaneous performance. The most useful as well as logical choices are an amplifier with combines 6V6's with EL-84's (for low to moderate power) or one which uses 6L6's with EL-34's for moderate to high power.) With these combinations, a single high voltage power supply and a single output transformer may be used and several important objects achieved:

A first object is that the single amplifier of the present invention can alternately produce the actual signature sounds of either of the two types of tubes-6V6 or EL-84— and thus genuine American or British musical styles are obtainable with true authenticity.

A second object is the selectability of output power. For those purists (and they are many) who insist that only power amplifier distortion is acceptable (and overdriven preamp saturation is not) the problem of correct wattage is a major concern. The differing conditions of room size and acoustics plus the number and type of other instruments in the band dictate a certain power level which is appropriate. Dedicated players are commonly known to bring a small fleet of different powered amplifiers so that may have the one that's right for the job. The amplifier of the present invention largely solves this problem by offering three different and selectable levels of output power: lowest is the single pair of 6V6's at around 15 watts; next is the two pairs of EL-84's operating alone to produce approximately 25 watts; last is the combined output of two 6V6's plus four EL-84's for a total capability of around 35 watts.

A further object of the present invention is the option of a further sonic characteristic achieved by using all tubes simultaneously. The tone thus produced is refined and highly desirable as the likeable tonal elements of each tube type seem to ameliorate the weaknesses of the other: the 6V6's soften the brashness of the EL-84 and add body to the lower regions. Simultaneously, the EL-84's cause the combined sound to retain tightness and articulation while preventing objectionable low end woofiness from taking over.

For the sake of illustrating the essence and the objects of the present invention a basic circuit is shown wherein cathode biasing is used for all devices. Those familiar with amplifier art will recognize that other well-known design factors may be included as well—such as the use of an output transformer with multiple taps along its primary for the different tube types or perhaps the use of different methods of biasing or differing classes of operation among the individual pairs possibly including switchable bias to further expand the potential for variety—but these techniques are embellishments to- or modifications of the present invention. Thus this disclosure seeks to be illustrative of the present invention while avoiding the great length required of outlining all the variations which one skilled in the art could foresee.

DETAILED DESCRIPTION OF THE DRAWING

Figure 1:
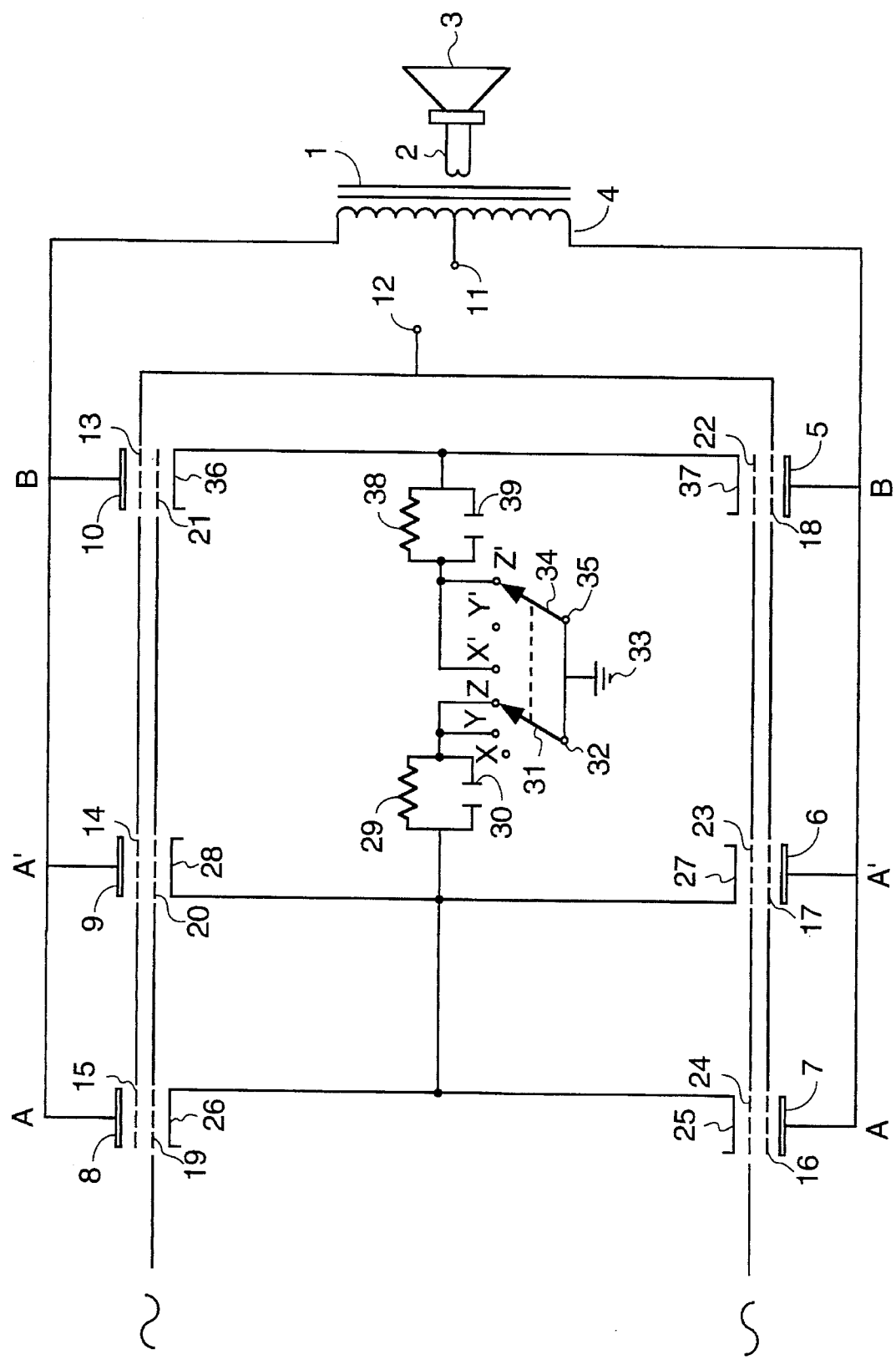
FIG. 1 is a schematic diagram showing the arrangement of major components in a preferred embodiment of the present invention.

The amplifier pictured in FIG. 1 comprises three pairs of pentode power devices A, A' and B. In one preferred embodiment, the devices used in pairs A and A' would be type EL-84 while those of pair B would be type 6V6. An output transformer 1 whose secondary winding 2 is coupled to a speaker 3 has its primary winding 4 connected to plates 5–10 inclusive, of the output devices. High voltage B+ is applied to the center tap 11 of the output transformer primary winding 4. Screen voltage is applied to a point 12 and coupled therefrom to the screen grids 13–18 of each power device. Split phase signal voltages are applied to signal grids 19–21, 22–24 of the push-pull pairs. Series resistors (not shown) may be required between the individual control grids and screen grids to prevent oscillation. The four cathodes 25–28 of the output pairs A and A' are connected together and coupled to a cathode bias resistor 29 which is bypassed by capacitor 30. Biasing resistor 29 and capacitor 30 are coupled to two terminals Y, Z of a three-position switch 31. When the switch 31 is set to select either position Y or Z, the pairs of devices A, A' are turned on to operate as the pole 32 of switch 31 is connected to ground and current flows through the switch 31 to the biasing components 29, 30 for the pairs A, A' of output devices. In position X of switch 31, the cathode circuit is open: no current flows and the pairs A, A' are off. In a similar fashion the cathodes 36, 37 of the B type pair of power devices are coupled through biasing components 38, 39 to a second switch section 34 which is ganged to operate in conjunction with the first switch section 31. Connections of biasing resistor 38 and bypass capacitor 39 to the switch 34 are arranged such that current flows from ground 33 when the switch 34 is in either of positions X' or Z' and thus the devices B are operable. Therefore in position X, X' of the switches 31, 34 only the B pair of tubes is operable, and in the preferred embodiment these would be type 6V6, delivering around 15 watts of American style blues power. In switch position Y, Y' the 6V6's of pair B are deactivated while the devices of A, A' are made operable. In the case of the preferred embodiment, these are type EL-84 and deliver approximately 25 watts of British style musical power. In position Z, Z' of the switch 31, 34 both A and B tube types in all three pairs A, A' and B operate simultaneously delivering an increase of power to around 35 watts and a combined musical tonality which is extremely complementary—and uniquely refined. The 6V6's soften the tendency toward harshness which the EL-84's alone may exhibit and fatten up the low end with rich, low order harmonic products. And concurrently the EL-84's add more than just power to the combined sound, their greater high-end emphasis produces a composite sound which retains articulation even when massively overdriven.

I claim:

1. A power output amplifier for use with electric guitar comprising a plurality of pairs of output devices arranged in a substantially push-pull-parallel configuration wherein at least two of said pairs comprise devices of dissimilar types and further including a switch means such that the pairs of differing types of output device may be selected to function alternately.

2. A power output amplifier for use with electric guitar comprising a plurality of pairs of output devices arranged in a substantially push-pull-parallel configuration wherein at least two of said pairs comprise devices of dissimilar types and further including a switch means such that pairs of differing types of output device may be selected to function alternately or simultaneously.

3. A power output amplifier comprising:

an output;

first amplification circuitry, selectively coupled to the output, for receiving an input signal, amplifying the input signal to produce a first amplified signal, and applying the first amplified signal to the output;

second amplification circuitry, selectively coupled to the output, for receiving the input signal, amplifying the input signal to produce a second amplified signal, and applying the second amplified signal to the output; and user-selectable switch, operatively coupled to the first and second amplification circuitry;

wherein the first amplification circuitry comprises one or more output devices of a first type;

further wherein the second amplification circuitry comprises one or more output devices of a second type, which is different from the first type;

further wherein the user-selectable switch has a first position in which the first amplification circuitry is operative and in which the second amplification circuitry is inoperative; and further wherein the user-selectable switch has a second position in which the first amplification circuitry is inoperative and in which the second amplification circuitry is operative.

4. The power output amplifier of claim 3 wherein the user-selectable switch has a third position in which the first and second amplification circuitry are both operative.

5. The power output amplifier of claim 3 wherein the first amplification circuitry comprises two or more output devices of the first type arranged in a substantially push-pull configuration.

6. The power output amplifier of claim 3 wherein the second amplification circuitry comprises two or more output devices of the second type arranged in a substantially push-pull configuration.

7. The power output amplifier of claim 3 wherein the first amplification circuitry comprises two or more output devices of the first type arranged in a substantially push-pull configuration; and further wherein the second amplification circuitry comprises two or more output devices of the second type arranged in a substantially push-pull configuration.

8. The power output amplifier of claim 3 wherein the first type is of the group consisting of 6V6 and 6L6 type pentodes.

9. The power output amplifier of claim 3 wherein the second type is of the group consisting of EL-84 and EL-34 type pentodes.

10. The power output amplifier of claim 3 wherein the first amplification circuitry and the second amplification circuit are substantially identical apart from the first type of output device in the first amplification circuitry and the second, different type of output device in the second amplification circuitry.

* * * * *